United States Patent
Erdmann et al.

(10) Patent No.: US 8,451,154 B2
(45) Date of Patent: May 28, 2013

(54) PIPELINED ADC CALIBRATION

(75) Inventors: Christophe Erdmann, Caen (FR); Arnaud Antoine Paul Biallais, Douvres la Delivrande (FR)

(73) Assignee: Integrated Device Technology, inc., San Jose, CA (US)

( * ) Notice: Subject to any disclaimer, the term of this patent is extended or adjusted under 35 U.S.C. 154(b) by 118 days.

(21) Appl. No.: 13/124,780

(22) PCT Filed: Oct. 19, 2009

(86) PCT No.: PCT/IB2009/054583
§ 371 (c)(1),
(2), (4) Date: Apr. 18, 2011

(87) PCT Pub. No.: WO2010/046831
PCT Pub. Date: Apr. 29, 2010

(65) Prior Publication Data
US 2011/0199244 A1 Aug. 18, 2011

(30) Foreign Application Priority Data

Oct. 22, 2008 (EP) .................................... 08290994
Oct. 19, 2009 (WO) .................. PCT/IB2009/054583

(51) Int. Cl.
*H03M 1/06* (2006.01)
(52) U.S. Cl.
USPC ........... 341/120; 341/118; 341/119; 341/155; 341/156
(58) Field of Classification Search
USPC ................. 341/155, 117, 118, 119, 120, 156, 341/161
See application file for complete search history.

(56) References Cited

U.S. PATENT DOCUMENTS

| 5,499,027 | A | 3/1996 | Karanicolas et al. |
| 6,784,814 | B1 * | 8/2004 | Nair et al. ...................... 341/118 |
| 6,801,151 | B1 * | 10/2004 | Opris ............................ 341/161 |
| 6,822,601 | B1 * | 11/2004 | Liu et al. ....................... 341/161 |
| 6,891,486 | B1 * | 5/2005 | Pentakota et al. ............. 341/120 |
| 6,894,631 | B1 | 5/2005 | Bardsley |
| 7,002,506 | B1 | 2/2006 | Tadeparthy et al. |
| 2005/0137802 | A1 | 6/2005 | Maloberti et al. |
| 2005/0219090 | A1 | 10/2005 | Jonsson et al. |
| 2006/0208933 | A1 | 9/2006 | Chen et al. |
| 2006/0227025 | A1 | 10/2006 | El-Sankary et al. |

FOREIGN PATENT DOCUMENTS

EP 0 981 204 A2 2/2000

OTHER PUBLICATIONS

Kinyua, M., et al. "Digital Background Auto-Calibration of DAC Non-Linearity in Pipelined ADCs", ISCAS 2004, 4 pages (2004).
Gines, A., et al. "Improved Background Algorithms for Pipeline ADC Full Calibration", IEEE, 4 pages (2007).
Karanicolas, A. "A 15-b 1-Msample/s Digitally Self-Calibrated Pipeline ADC," IEEE J. of Solid-State Circuits, vol. 28, No. 12, pp. 1207-1215 (Dec. 1993).
Sumanen, L., et al. "A Digital Self-Calibration Method for Pipeline A/D Converters", Proc. IEEE Int'l. Symp. on Circuits & Systems, vol. 2, pp. II/792-II795 (May 2002).
International Search Report and Written Opinion for Int'l. Patent Application PCT/IB2009/054583 (Mar. 4, 2010).

\* cited by examiner

*Primary Examiner* — Jean B Jeanglaude
(74) *Attorney, Agent, or Firm* — Hayes and Boone LLP

(57) ABSTRACT

A method of calibrating a pipelined analog to digital converter having a plurality of DAC elements and an additional calibration DAC element is provided. In the method as provided herein, a combination of positive, negative and zero reference voltages are applied to the element under calibration and positive and negative reference voltages are applied to the additional calibration DAC element to obtain four calibration states. An error of the DAC element under calibration is extracted by calculating an average of the difference between the four calibration states.

12 Claims, 3 Drawing Sheets

PIPELINED ADC CALIBRATION

TECHNICAL FIELD OF THE INVENTION

The invention relates to element calibration in pipelined analog to digital converters.

BACKGROUND ART

Analog-to-digital converters are widely used in many electronic devices, and are key components in interfaces between the analog world and the digital domain. In order to satisfy increasingly demanding application requirements, the performance of such converters, for example in terms of resolution, speed and power consumption, are increasing. High-resolution, high-speed and low power converters, for example greater than 12-bit resolution at >20M samples per second and <400 mW power consumption, cannot rely on the matching performances of standard fabrication processes. Various calibration techniques tend therefore to be used.

FIG. 1 represents an exemplary known pipeline stage 100 incorporating element calibration, as described in U.S. Pat. No. 5,499,027. The DAC element under calibration 110 is connected to reference voltage +/−Vref according to a calibration state signal. FIG. 2 shows the two calibration states S1, S2 on the transfer curve 210 of the stage 100, the difference between the two states being given by $\Delta$=S1−S2. Extraction of the element error is carried out by averaging the difference between the states, i.e. $\epsilon_{element}=(\Delta-\Delta_{ideal})/\Delta_{ideal}$ with $\Delta_{ideal}=+V_{ref}$. One can see that the processing is applied with zero input, i.e. Vin is held at 0V while calibration of the element 110 takes place.

The above technique is well suited for multi-bit pipeline converters using m-bit stages (with m being an integer). Such a converter uses $2^m-1$ DAC elements. The number of switches in the DAC 120, however, limit the maximum achievable working frequency of the whole converter 100. In order to increase the working frequency, a (m−0.5)-bit, or half integer bit, stage may be used because only $2^{m-1}-1$ capacitors and a corresponding number of switches are needed, thus limiting drastically the number of inter-connections. In an (m−0.5)-bit stage, however, the element calibration described above is not usable because the calibration states are equal to the coding capabilities of the following stages, as shown in FIG. 3. In practice, the calibration algorithm is therefore no longer viable.

As described herein, for a given pipeline stage the coding capability at the output of the stage relates to the range a signal can be further coded by subsequent pipeline stages. Exceeding this coding capability results in the introduction of non-linear behaviour, leading to incorrect calibration. For example, for a coding capability of between 1 and 10, numbers greater than 10 are coded as 10 numbers lower than 1 are coded as 1.

OBJECT OF INVENTION

It is an object of the invention to address the above mentioned problem.

SUMMARY OF INVENTION

According to a first aspect of the invention there is provided a method of calibrating a DAC element in a stage of a pipelined analog to digital converter, the method comprising:

providing a plurality of DAC elements each having a capacitor with a first plate connected to an operational amplifier and a second plate switchably connected to one of an input signal voltage Vin, a positive reference voltage +Vref, a negative reference voltage −Vref and a common voltage 0;

providing an additional DAC element having a capacitor with a first plate switchably connected to the operational amplifier and a second plate switchably connected to one of the positive reference voltage +Vref and the negative reference voltage −Vref;

selecting one of the plurality of DAC elements to be an element under calibration;

applying a sequence of signals to the additional DAC element and the element under calibration to obtain four calibration states while the input signal voltage to the element under calibration is held at 0; and extracting an element error of the element under calibration by calculating an average of the difference between different pairs of the four calibration states.

The four calibration states may comprise:

a first calibration state obtained by applying +Vref to the additional DAC element and −Vref to the element under calibration;

a second calibration state obtained by applying −Vref to the additional DAC element and 0 to the element under calibration;

a third calibration state obtained by applying +Vref to the additional DAC element and 0 to the element under calibration; and a fourth calibration state obtained by applying −Vref to the additional DAC element and +Vref to the element under calibration.

The four calibration states may comprise:

a first calibration state that is proportional to a difference between the value of the additional DAC element and the value of the element under calibration;

a second calibration state that is proportional to the value of the additional DAC element;

a third calibration state that is a negative of the second calibration state; and a fourth calibration state that is a negative of the first calibration state.

The average of the difference between the four calibration states S1 to S4 may be given by:

$$\varepsilon_{element} = \frac{\Delta_2 + \Delta_1 - 2\Delta_{ideal}}{2\Delta_{ideal}}$$

wherein $\epsilon_{element}$ is the element error, $\Delta_1$=S2−S3, $\Delta_2$=S1−S4 and $\Delta_{ideal}=+V_{ref}$.

The capacitor of the additional DAC element may have a capacitance less than or equal to the capacitor of the element under calibration.

According to a second aspect of the invention there is provided a pipelined analog to digital converter comprising a plurality of stages, each stage comprising:

an operational amplifier;

a plurality of DAC elements each having a capacitor with a first plate connected to the operational amplifier and a second plate switchably connected to one of a positive reference voltage +Vref, a negative reference voltage −Vref and a common voltage 0;

an additional DAC element having a capacitor with a first plate switchably connected to the operational amplifier and a second plate switchably connected to one of the positive reference voltage +Vref and the negative reference voltage −Vref;

means for selecting one of the plurality of DAC elements to be an element under calibration;

means for applying a sequence of calibration state signals to the additional DAC element and the element under calibration to obtain four calibration states while the input signal voltage to the element under calibration is held at 0; and means for extracting an element error of the element under calibration by calculating an average of the difference between different pairs of the four calibration states.

The means for applying a sequence of calibration state signals to the additional DAC element and the element under calibration may be configured to:

obtain a first calibration state by applying +Vref to the extra DAC element and −Vref to the element under calibration;

obtain a second calibration state by applying −Vref to the extra DAC element and 0 to the element under calibration;

obtain a third calibration state by applying +Vref to the extra DAC element and 0 to the element under calibration;

obtain a fourth calibration state by applying −Vref to the extra DAC element and +Vref to the element under calibration.

The means for applying a sequence of calibration state signals to the additional DAC element and the element under calibration may be configured to:

obtain a first calibration state that is proportional to a difference between the value of the additional DAC element and the value of the element under calibration;

obtain a second calibration state that is proportional to the value of the additional DAC element;

obtain a third calibration state that is proportional to a negative value of the additional DAC element;

obtain a fourth calibration state that is proportional to a difference between the value of the element under calibration and the value of the additional DAC element.

According to a third aspect of the invention there is provided a method of calibrating a DAC element in a stage of a pipelined analog to digital converter, the method comprising:

providing a plurality of DAC elements each connected to an operational amplifier and switchably connected to one of an input signal voltage, a positive reference voltage, a negative reference voltage and a common voltage;

providing an additional DAC element switchably connected to the operational amplifier and to one of the positive reference voltage and the negative reference voltage;

selecting one of the plurality of DAC elements to be an element under calibration;

applying a sequence of signals from the positive, negative and common voltages to the additional DAC element and the element under calibration to obtain four calibration states while the input signal voltage to the element under calibration is held at zero; and extracting an element error of the element under calibration by calculating an average of the difference between different pairs of the four calibration states.

According to a fourth aspect of the invention there is provided a pipelined analog to digital converter comprising a plurality of stages, each stage comprising:

a plurality of DAC elements each connected to an operational amplifier and switchably connected to one of an input signal voltage, a positive reference voltage, a negative reference voltage and a common voltage;

an additional DAC element switchably connected to the operational amplifier and to one of the positive reference voltage and the negative reference voltage;

means for selecting one of the plurality of DAC elements to be an element under calibration;

means for applying a sequence of signals from the positive, negative and common voltages to the additional DAC element and the element under calibration to obtain four calibration states while the input signal voltage to the element under calibration is held at zero; and means for extracting an element error of the element under calibration by calculating an average of the difference between different pairs of the four calibration states.

In a general aspect, the invention relates to a method of calibrating a pipelined analog to digital converter having a plurality of DAC elements and an additional calibration DAC element, in which a combination of positive, negative and zero reference voltages are applied to the element under calibration and positive and negative reference voltages applied to the additional calibration DAC element to obtain four calibration states from which an error of the element under calibration is extracted by calculating an average of the difference between the four calibration states.

In order to keep the calibration algorithm working properly, the calibration states must lie within the coding capability of the subsequent pipeline stages. This problem may be addressed according to the invention by adding an extra DAC element, the value of which may be unknown. This leads to 2 unknowns: i) the value of the DAC element under calibration; and ii) the value of the extra DAC element. To solve for two unknowns, two relationships are required. These correspond to the 4 states from the calibration method according to the invention, from which two independent differences can be calculated. Four calibration states is therefore the minimum number required extract the error in the DAC element under calibration.

BRIEF DESCRIPTION OF THE DRAWINGS

Embodiments of the invention will now be described by way of example, with reference to the accompanying drawings in which.

SPECIFIC DESCRIPTION OF THE EMBODIMENTS

Figure 1:
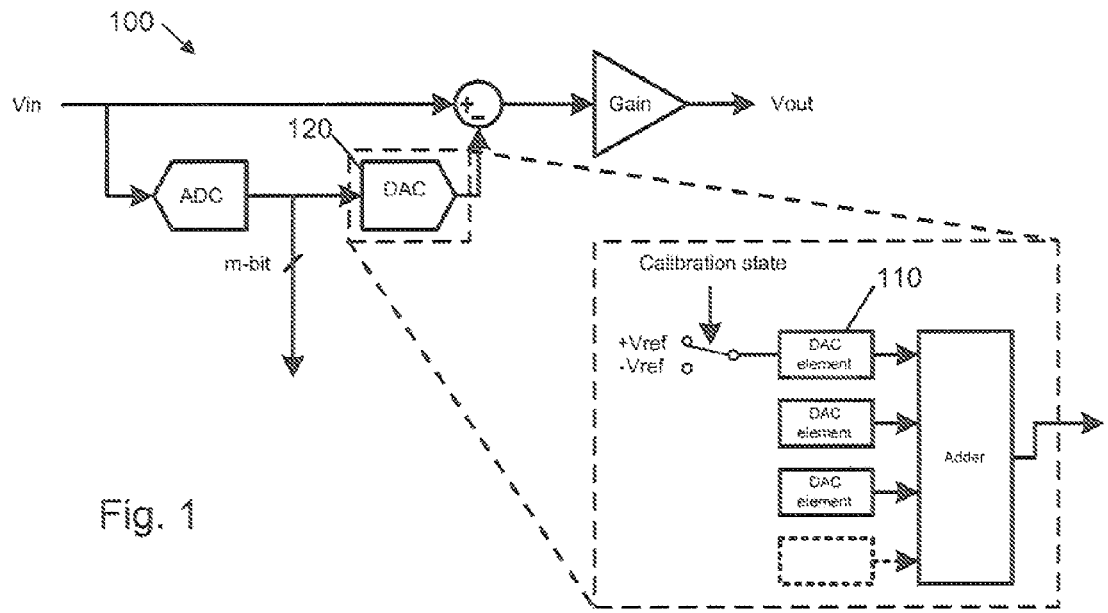
FIG. 1 illustrates a block diagram of a stage of a pipelined analog to digital converter.
Figure 2:
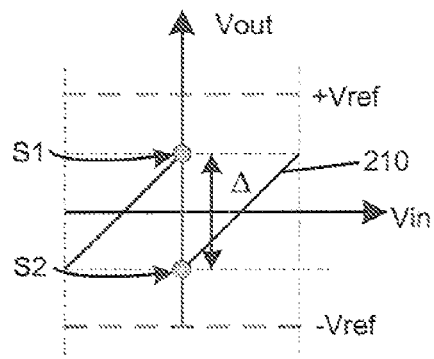
FIG. 2 illustrates a transfer function of the stage of FIG. 1, with calibration states.
Figure 3:
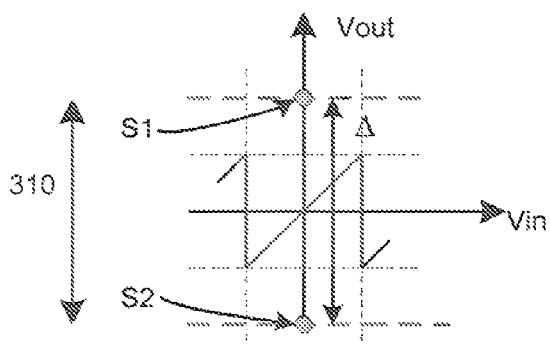
FIG. 3 illustrates a transfer function of a (m−0.5)-bit stage with calibration states.

FIGS. 1 to 3 have already been discussed above as part of the background to the invention.

Figure 4:
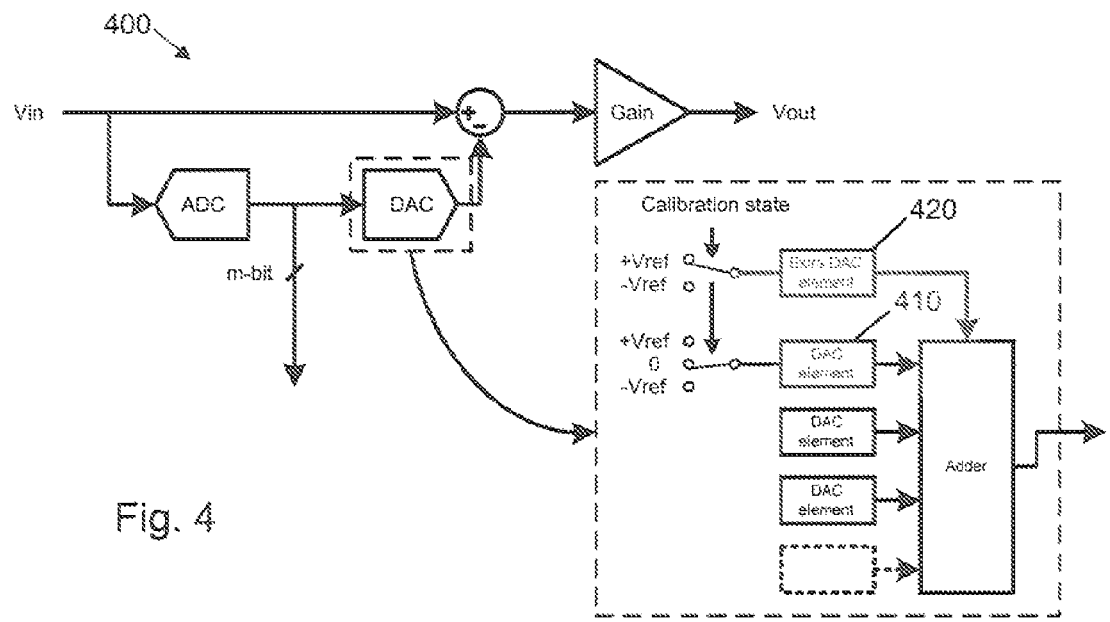
FIG. 4 illustrates a block diagram of a stage of a pipelined analog to digital converter according to an embodiment of the invention.
Figure 5:
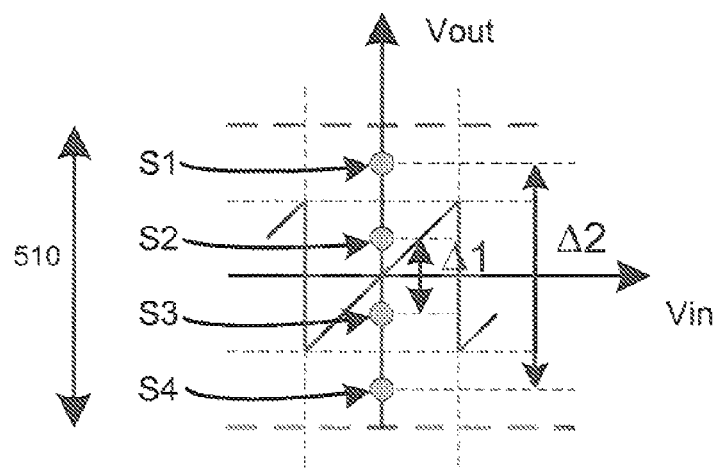
FIG. 5 illustrates a transfer function of the stage of FIG. 4.

A pipeline stage 400 having element calibration according to the invention is shown in FIG. 4. An additional DAC element 420 is provided to keep the extreme states (states 1 and 4) within the range of coding capability 510 of subsequent stages during calibration. The process of calibration is illustrated in FIG. 5. Two new states S2 and S3 are introduced by using the additional DAC element 420 to allow the calibration algorithm to work properly. A calibration state signal controls both the element under calibration 410 and the extra element 420, according to the values given in table 1 below.

As described herein, for a given pipeline stage the coding capability of the output of the stage relates to the range a signal can be further coded by subsequent pipeline stages. Exceeding this coding capability results in the introduction of non-linear behaviour leading to incorrect calibration. For example, for a coding capability of between 1 and 10, numbers greater than 10 are coded as 10, and numbers lower than 1 are coded as 1.

The calibration states S1 to S4 are used to extract differences Δ1 and Δ2, shown in FIG. 5. These differences characterise the errors of both the DAC element 410 under calibration and the additional DAC element 420. Each of these calibration states are preferably generated a number of times over a calibration time period, and average values for Δ1 and Δ2 calculated.

As shown in table 1 below, calibration state 1 is obtained by applying −Vref to the DAC element 410 under calibration, with +Vref applied to the extra DAC element 420. State 2 is obtained by applying 0V to the DAC element 410 under calibration, with −Vref applied to the extra DAC element 420. State 3 is obtained by applying 0V to the DAC element 410 under calibration, with +Vref applied to the extra DAC element 420. State 4 is obtained by applying +Vref to the DAC element 410 under calibration and −Vref to the extra DAC element 420.

TABLE 1

Element connection versus calibration state

|  | State 1 | State 2 | State 3 | State 4 |
|---|---|---|---|---|
| DAC element under calibration | −Vref | 0 | 0 | +Vref |
| Extra DAC element | +Vref | −Vref | +Vref | −Vref |

Extraction of the element error $\epsilon_{element}$ for the DAC element 410 is carried out by averaging the difference between the states as follows:

$$\varepsilon_{element} = \frac{\Delta_2 + \Delta_1 - 2\Delta_{ideal}}{2\Delta_{ideal}}$$

where $\Delta_1$=S2−S3, $\Delta_2$=S1−S4 and $\Delta_{ideal}$=+$V_{ref}$.

The first calibration state S1 is proportional to the difference between the value of the additional DAC element 420 and the value of the element under calibration 410. The second calibration state S2 is proportional to the value of the additional DAC element 420. The third calibration state S3 is proportional to a negative value of the additional DAC element 420, i.e. is a negative of the second calibration state. The fourth calibration state S4 is proportional to the difference between the value of the element under calibration 410 and the value of the additional DAC element 420, i.e. is a negative of the first calibration state. From the above relationships, $\Delta_1$ corresponds to twice the value of the additional DAC element 420, and $\Delta_2$ corresponds to twice the difference between the element under calibration 410 and the additional DAC element 420.

The four different calibration states S1 to S4 can alternatively be expressed as follows:

$S1 = \alpha \times (\text{Element\_under\_calibration} - \text{Element\_additional})$ $S2 = \alpha \times \text{Element\_additional}$ $S3 = -\alpha \times \text{Element\_additional} = -S2$ $S4 = \alpha \times (\text{Element\_additional} - \text{Element\_under\_calibration}) = -S1$ where α is a proportional constant.

Figure 6:
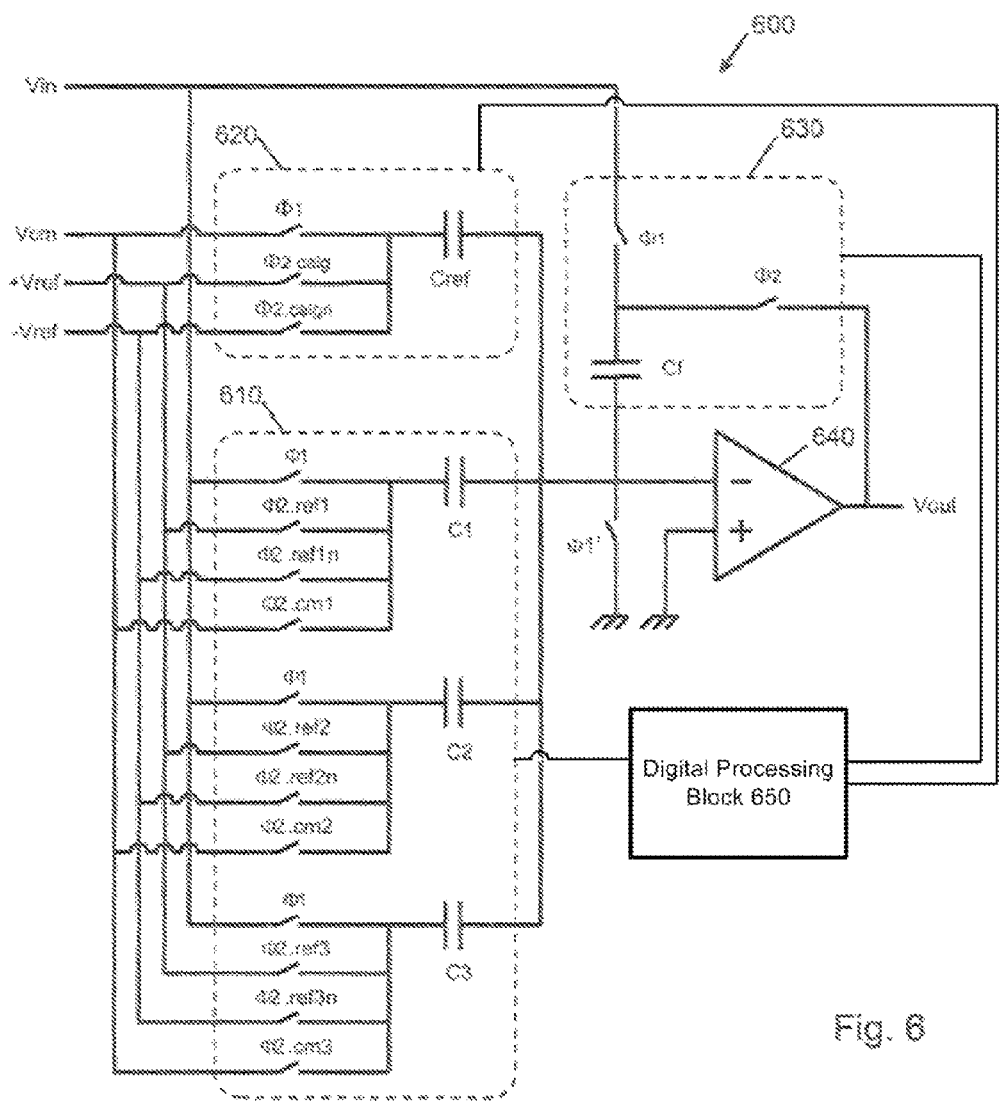
FIG. 6 illustrates a circuit diagram of an exemplary embodiment of a 2.5-bit implementation of a stage of a pipelined analog to digital converter according to the invention.

FIG. 6 illustrates an exemplary implementation of a 2.5-bit MDAC (multiplying DAC) 600, i.e. where m=3, the MDAC comprising three DAC elements 610, a feedback element 630 and an additional DAC element 620 for calibration, all of which are connected to an operational amplifier 640 and switchably connected to one or more of an input voltage Vin, positive and negative reference voltages +Vref, −Vref and a common or ground voltage Vcm. The extra DAC element 620 comprises a capacitor element $C_{ref}$ used for element calibration. $C_{ref}$ can have a nominal value of between 0 and C, where C is the value of each of the capacitors C1, C2, C3 in the DAC elements 610. However, the exact value of each capacitor is not necessarily known.

In FIG. 6, φ1 and φ2 indicate non-overlapping out of phase clock signals used to operate the switched capacitor circuit. Clock signal φ1' is a time delayed version of φ1. When φ1 is active or high, switches controlled by φ1 are closed. When φ2 is active or high, switches controlled by φ2 are closed. Clock signal φ1 activates the sampling phase (i.e. sampling of the input voltage Vin), while clock signal φ2 activates the amplification phase (also known as the hold phase or charge transfer phase). Clock signal φ2.ref1 indicates a logical AND of signals φ2 and ref1. During the amplification phase, +Vref, −Vref or 0 (Vcm) is applied to each of the capacitors C1, C2 and C3, depending respectively on the value of ref1, ref2, ref3, ref1n, ref2n, ref3n and cm1, cm2, cm3.

Additional circuitry to that shown in FIG. 6 for carrying out the calibration procedure includes a circuit to hold Vin to zero during calibration, a digital processing block 650 for executing the calibration algorithm, i.e. for controlling the signals applied to the DAC elements during calibration, for receiving the calibration states and extracting and storing the error of the DAC elements as outlined above. A correcting block (either analog or digital) is provided at the output of the circuit to allow for correction of the calculated error of the DAC elements using the extracted error as determined by the processing block.

During the calibration process, Vin is held at zero. Operation of the pipeline stage is therefore held up while calibration takes place. The error of the different DAC elements may be extracted sequentially. Once the calibration process is completed, the MDAC 600 returns to normal operation, and the extracted errors then applied to the output of the circuit.

The term 'DAC element' used herein is typically associated with a capacitor. This is the case for a switched capacitor implementation of MDAC of the pipeline stage (as depicted in FIG. 6). However, other forms of pipeline stage can be implemented using the calibration scheme described herein. For example, a current-mode DAC or a voltage-mode DAC can be used to implement the pipeline stage; in both cases the DAC would be composed of DAC elements amenable to being calibrated using the methods described above. Where the DAC elements are current-based, each DAC element is a current source. The connection to +Vref or −Vref in a capacitor-based DAC corresponds, in a current-based DAC, to directing current with a current source in a positive or negative direction. Similarly, the DAC elements of a voltage-based DAC are voltage sources, with the connection to +Vref or −Vref in a capacitor-based DAC corresponding to addition or subtraction of the voltage source.

The listing or discussion of a prior-published document in this specification should not necessarily be taken as an acknowledgement that the document is part of the state of the art or is common general knowledge.

Other embodiments are intentionally within the scope of the invention as defined by the appended claims.

The invention claimed is:

1. A method of calibrating a DAC element in a stage of a pipelined analog to digital converter, the method comprising:
providing a plurality of DAC elements each having a capacitor with a first plate connected to an operational amplifier and a second plate switchably connected to one of an input signal voltage Vin, a positive reference voltage +Vref, a negative reference voltage −Vref and a common voltage 0;
providing an additional DAC element having a capacitor with a first plate connected to the operational amplifier and a second plate switchably connected to one of the positive reference voltage +Vref and the negative reference voltage −Vref;
selecting one of the plurality of DAC elements to be a DAC element under calibration;
applying a sequence of signals to the additional DAC element and the DAC element under calibration to obtain four calibration states while the input signal voltage to the DAC element under calibration is held at 0; and
extracting a DAC element error of the DAC element under calibration by calculating an average of the difference between different pairs of the four calibration states.

2. The method of claim 1 in which:
a first calibration state is obtained by applying +Vref to the additional DAC element and −Vref to the DAC element under calibration;
a second calibration state is obtained by applying −Vref to the additional DAC element and 0 to the DAC element under calibration;
a third calibration state is obtained by applying +Vref to the additional DAC element and 0 to the DAC element under calibration; and
a fourth calibration state is obtained by applying −Vref to the additional DAC element and +Vref to the DAC element under calibration.

3. The method of claim 1 in which:
a first calibration state is obtained that is proportional to a difference between the value of the additional DAC element and the value of the DAC element under calibration;
a second calibration state is obtained that is proportional to the value of the additional DAC element;
a third calibration state is obtained that is a negative of the second calibration state; and
a fourth calibration state is obtained that is a negative of the first calibration state.

4. The method according to claim 1 wherein the average of the difference between the four calibration states S1 to S4 is given by:

$$\varepsilon_{element} = \frac{\Delta_2 + \Delta_1 - 2\Delta_{ideal}}{2\Delta_{ideal}}$$

wherein $\varepsilon_{element}$ is the DAC element error, $\Delta_1$=S2−S3, $\Delta_2$=S1−S4 and $\Delta_{ideal}$=+$V_{ref}$.

5. The method according to claim 1 wherein the capacitor of the additional DAC element has a capacitance less than or equal to the capacitor of the DAC element under calibration.

6. A pipelined analog to digital converter comprising a plurality of stages, each stage comprising:
an operational amplifier;
a plurality of DAC elements each having a capacitor with a first plate connected to the operational amplifier and a second plate switchably connected to one of a positive reference voltage +Vref, a negative reference voltage −Vref and a common voltage 0;
an additional DAC element having a capacitor with a first plate connected to the operational amplifier and a second plate switchably connected to one of the positive reference voltage +Vref and the negative reference voltage −Vref;
a selector for choosing one of the plurality of DAC elements to be a DAC element under calibration; and
a digital processing block for applying a sequence of calibration state signals to the additional DAC element and the DAC element under calibration to obtain four calibration states while the input signal voltage to the DAC element under calibration is held at 0 and for extracting a DAC element error of the DAC element under calibration by calculating an average of the difference between different pairs of the four calibration states.

7. The pipelined analog to digital converter of claim 6 wherein the digital processing block is configured to:
obtain a first calibration state by applying +Vref to the additional DAC element and −Vref to the DAC element under calibration;
obtain a second calibration state by applying −Vref to the additional DAC element and 0 to the DAC element under calibration;
obtain a third calibration state by applying +Vref to the additional DAC element and 0 to the DAC element under calibration; and
obtain a fourth calibration state by applying −Vref to the additional DAC element and +Vref to the DAC element under calibration.

8. The pipelined analog to digital converter of claim 6 wherein the digital processing block is configured to:
obtain a first calibration state that is proportional to a difference between the value of the additional DAC element and the value of the DAC element under calibration;
obtain a second calibration state that is proportional to the value of the additional DAC element;
obtain a third calibration state that is a negative of the second calibration state; and
obtain a fourth calibration state that is a negative of the first calibration state.

9. The pipelined analog to digital converter according to claim 6 wherein the average of the difference between the four calibration states S1 to S4 is given by:

$$\varepsilon_{element} = \frac{\Delta_2 + \Delta_1 - 2\Delta_{ideal}}{2\Delta_{ideal}}$$

wherein $\varepsilon_{element}$ is the DAC element error, $\Delta_1$=S2−S3, $\Delta_2$=S1−S4 and $\Delta_{ideal}$=+$V_{ref}$.

10. The pipelined analog to digital converter according to claim 6 wherein the capacitor of the additional DAC element has a capacitance less than or equal to the capacitor of the DAC element under calibration.

11. A method of calibrating a DAC element in a stage of a pipelined analog to digital converter, the method comprising:
providing a plurality of DAC elements each connected to an operational amplifier and switchably connected to one of an input signal voltage, a positive reference voltage, a negative reference voltage and a common voltage;

providing an additional DAC element switchably connected to the operational amplifier and to one of the positive reference voltage and the negative reference voltage;

selecting one of the plurality of DAC elements to be a DAC element under calibration;

applying a sequence of signals from the positive, negative and common voltages to the additional DAC element and the DAC element under calibration to obtain four calibration states while the input signal voltage to the DAC element under calibration is held at zero; and extracting a DAC element error of the DAC element under calibration by calculating an average of the difference between different pairs of the four calibration states.

12. A pipelined analog to digital converter comprising a plurality of stages, each stage comprising:

a plurality of DAC elements each connected to an operational amplifier and switchably connected to one of an input signal voltage, a positive reference voltage, a negative reference voltage and a common voltage;

an additional DAC element switchably connected to the operational amplifier and to one of the positive reference voltage and the negative reference voltage;

a selector for choosing one of the plurality of DAC elements to be a DAC element under calibration;

a digital processing block for applying a sequence of signals from the positive, negative and common voltages to the additional DAC element and the DAC element under calibration to obtain four calibration states while the input signal voltage to the DAC element under calibration is held at zero and for extracting a DAC element error of the DAC element under calibration by calculating an average of the difference between different pairs of the four calibration states.

\* \* \* \* \*